United States Patent
Spartiotis et al.

(12) 
(10) Patent No.: US 6,323,475 B1
(45) Date of Patent: *Nov. 27, 2001

(54) HYBRID SEMICONDUCTOR IMAGING DEVICE HAVING PLURAL READOUT SUBSTRATES

(75) Inventors: Konstantinos Evangelos Spartiotis, Athens (GR); Jouni Hari Pyyhtiä, Vantaa (FI); Miltiadis Evangelos Sarakinos, Geneva (CH)

(73) Assignee: Simage Oy, Espoo (FI)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/095,152

(22) Filed: Jun. 10, 1998

(30) Foreign Application Priority Data

Dec. 18, 1997 (GB) .................................................. 9726765

(51) Int. Cl.⁷ .................................................. H01L 27/00
(52) U.S. Cl. ..................................... 250/208.1; 250/214 R
(58) Field of Search .......................... 250/208.1, 214.1, 250/214 R, 370.18, 370.14; 257/432, 446; 348/308, 302, 304

(56) References Cited

U.S. PATENT DOCUMENTS

| 4,743,751 | * | 5/1988 | Arques et al. ...................... 250/214.1 |
| 5,245,191 | * | 9/1993 | Barber et al. ..................... 250/363.04 |
| 5,336,879 | | 8/1994 | Sauer ................................... 250/208 |
| 5,812,191 | * | 9/1998 | Orava et al. .......................... 348/308 |

FOREIGN PATENT DOCUMENTS

| 0 421 869 | 4/1991 | (EP) . |
| 0 577 487 | 5/1994 | (EP) . |
| 2 305 096 | 3/1997 | (GB) . |
| WO95/33332 | 12/1995 | (WO) . |

* cited by examiner

*Primary Examiner*—Que T. Le
(74) *Attorney, Agent, or Firm*—Kenyon & Kenyon

(57) ABSTRACT

An imaging device includes one detector substrate with a plurality of readout substrates connected thereto. The detector substrate has a bias contact on a first surface and a number of detector cell contacts on a second surface. The readout substrate includes a plurality of readout circuits. The readout substrates are all mechanically connected to the detector substrate with the readout circuits electrically connected to respective detector cell contacts. To allow for areas of the readout substrates with no readout circuits or gaps between readout circuits, conductive tracks lead from selected detector positions to offset readout circuit position.

13 Claims, 5 Drawing Sheets

HYBRID SEMICONDUCTOR IMAGING DEVICE HAVING PLURAL READOUT SUBSTRATES

FIELD OF THE INVENTION

The invention relates to hybrid imaging devices, for example for high energy radiation imaging, for example radiation having energies in excess of 1 keV, such as X-rays.

BACKGROUND OF THE INVENTION

Traditional arrangements for X-ray imaging, including cassette film, other modalities such as wire chambers, scintillating crystals or screens, (e.g. Sodium Iodide NaI), BGO (Bismuth Germanium Oxide) and CR plates (Computed Radiography), have been utilized over the past forty years.

More recently, semiconductor imaging devices have been employed, including CCD-based devices, both in stand-alone implementations and coupled to scintillating screens, silicon microstrip detectors and semiconductor pixel detectors.

Semiconductor pixel detectors, such as have been described in the Applicants's International patent application WO95/33332, based on ASIC (Application Specific Integrated Circuit) CMOS processing, can provide high spatial resolution, direct detection, compactness, high absorption efficiency and real-time imaging. However, limitations (e.g. yield) of ASIC CMOS technology based on, for example, crystalline or polycrystalline semiconductor technology, limit the maximal size of monolithic detectors to a few square centimeters. Various methods of combining individual monolithic detectors have been, therefore, proposed. The major challenge is the formation of continuous imaging areas larger than that possible with a single hybrid imaging device without any blind regions.

One method of eliminating such inactive regions in the final image has been the use of software interpolation. However, this method does not recover lost information but only provides an approximation.

Other methods for combining monolithic detectors in large imaging areas without the presence of inactive regions have been proposed.

In the Applicant's International patent application WO 95/33332 mentioned above, a tiling approach is proposed where individual detectors are staggered on a mosaic in such a manner that one third of the total desired area is imaged in a single exposure. Three different exposures, at different positions of the mosaic, are required. The approach is cost efficient as it reduces the total number of required detectors and allows for replacement of defective detectors. Nevertheless, this solution requires a moving device, translating the imaging area in two subsequent positions. A total of three snapshots are taken in order to provide substantially continuous coverage.

The Applicant's UK patent application GB-A-2,305,096 describes an approach to the mounting of imaging devices on a support plane, in which imaging devices are secured to a mount to form an imaging device tile, and then the tile is removably mounted on a support plane by means of screws, vacuum, or other fastening arrangements permitting non-destructive removable mounting of the imaging device tiles. However, this application does not address the problems of avoiding edge effects between imaging devices.

In European patent application EP-A-0,421,869, an approach to the joining of individual image detectors is described. The detectors are glued to a stepped support with a detector on a step extending beyond the edge of the step to partially overly a detector on the next lower step. Although this approach allows for large area continuous imaging, it provides a rigid device whose thickness increases with imaging area. Furthermore, as individual detectors are rigidly glued on the apparatus defective component replacement is not addressed.

Another approach to large area imaging is described in European patent application EP-A-0,577,487. The approach provides an imaging apparatus comprising several individual detector substrates arranged adjacent to each other and rigidly connected to each other by means of support substrates which overlap adjacent detector substrates. The detector substrates are rigidly connected to the support substrates by means of indium bumps. Although the total thickness of the apparatus is independent of the imaging area, the overall structure is, once again rigid. Also, the constructions proposed in EP-A-0,577,487 are likely to suffer from edge effects or inactive regions along the boundaries between two detectors.

Thus, several proposals provide large area continuous coverage without use of mechanical motion and without use of software interpolation. Such solutions find application in dental imaging, real time imaging, conventional radiography (e.g. chest X-rays) as well as in the field of industrial X-ray imaging and non-destructive testing.

Although existing proposals are intended for constructing large imaging areas, there exist applications requiring imaging areas around 30 $cm^2$ less. For example, in intraoral imaging, the desired area is around 10 $cm^2$ and the overall imaging device thickness is highly constrained, preferably under 5 mm or, even better, under 3 mm.

The present invention seeks to provide a solution to the provision of a hybrid semiconductor imaging array providing an area larger than that possible with prior hybrid imaging devices using CMOS based readout chips without the bulk and complexity and/or requirements for movement or interpolation of the prior art.

Particular and preferred aspects of the invention are set out in the accompanying independent and dependent claims. Features from dependent claims may be combined with those of the independent claims in any appropriate manner and not merely in the specific combinations enumerated in the claims.

SUMMARY OF THE INVENTION

In accordance with one aspect of the invention, there is provided a hybrid semiconductor imaging device comprising:

a detector substrate, which detector substrate has a bias contact on a first surface and a plurality of detector cell contacts on a second surface; and a plurality of readout substrates comprising a plurality of readout circuits and a corresponding plurality of readout circuit contacts, said plurality of readout substrates being connected to said detector substrate with said readout circuit contacts electrically connected to respective detector cell contacts, wherein at least one readout circuit contact is offset with respect to a said respective detector cell contact.

Accordingly, an embodiment of the invention provides an approach to forming an imaging array different from that of the prior art. All prior art approaches are based on methods for joining smaller monolithic detectors into large area mosaics with a plurality of detecting substrates and a plurality of CMOS readout layers. Typically the number of detector substrates and the number of readout substrates are substantially equal. In contradistinction thereto, in an embodiment of the invention, an imaging device comprises one detector substrate with a plurality of readout chips connected thereto. No direct contact, either electrical or mechanical, between the readout substrates is needed. The readout substrates are mechanically and electrically connected to the single detector substrate.

By arranging that readout circuit(s) on the readout substrate do not need to be aligned directly with the corresponding detector cells, but can be out of register (i.e. offset) with respect thereto, areas of the detector substrate located in a region between readout substrates or over a non-active region of the readout substrates, which would otherwise be inactive or give very poor resolution, can be made active with good resolution. Thus a continuous detecting plane with good resolution can be achieved.

An embodiment of the invention can provide an imaging device providing continuous imaging while constraining the detector thickness to a minimum. Also, a relatively large area imaging device can be produced without the readout substrate needing to be so large that manufacturing yield decreases.

In a preferred embodiment, the plurality of readout substrates are bump-bonded to the readout detector substrate.

Conductive tracks enable a readout circuit contact to be connected to a detector cell contact offset with respect thereto. In particular, in a preferred embodiment a conductive track extends from a respective detector cell contact to a transfer cell contact position aligned with a readout cell contact. The transfer contact is then bump-bonded to the readout cell contact. The conductive track(s) and the transfer contact(s) can be formed on the second surface of the detector but electrically insulated therefrom by an intermediate insulative layer. The conductive track or tracks could alternatively, or additionally be formed on a separate intermediate substrate.

A support substrate can also be mechanically and electrically connected to the readout substrates. The readout substrates can be mechanically and electrically connected to the detector substrate at a first surface of the readout substrates, the readout substrates being mechanically and electrically connected to the support substrate at a second surface of the readout substrates. For example, the readout substrates can by bump-bonded to the support substrate. Preferably, however, wire bonds are used for the electrical connections.

Thus, a support substrate, or mother board, can be provided for mechanical support of the assembly of the detector substrate and readout substrates and for electrical connection to and readout from the readout substrates.

The invention also provides an imaging system comprising an imaging device as described above.

In accordance with another aspect of the invention, there is provided a method of manufacturing a hybrid semiconductor imaging device, the method comprising:

forming a detector substate, which detectors substrate has a bias contact on a first surface and a plurality of detector cell contacts on a second surface; and sequentially connecting a plurality of readout substrates comprising a plurality of readout circuits with respect readout circuit contacts, the plurality of readout substrates being connected to the detector substrate with the readout circuit contacts electrically connected to respective detector cell contacts and with at least one the readout circuit contact offset with respect to the respective detector cell contact.

During manufacture, defective semiconductor substrates can be removed after bonding and replaced by new semiconductor substrates.

DESCRIPTION OF THE EMBODIMENTS OF THE INVENTION

Exemplary embodiments of the invention are described hereinafter, by way of example only, with reference to the accompanying drawings.

Figure 1:
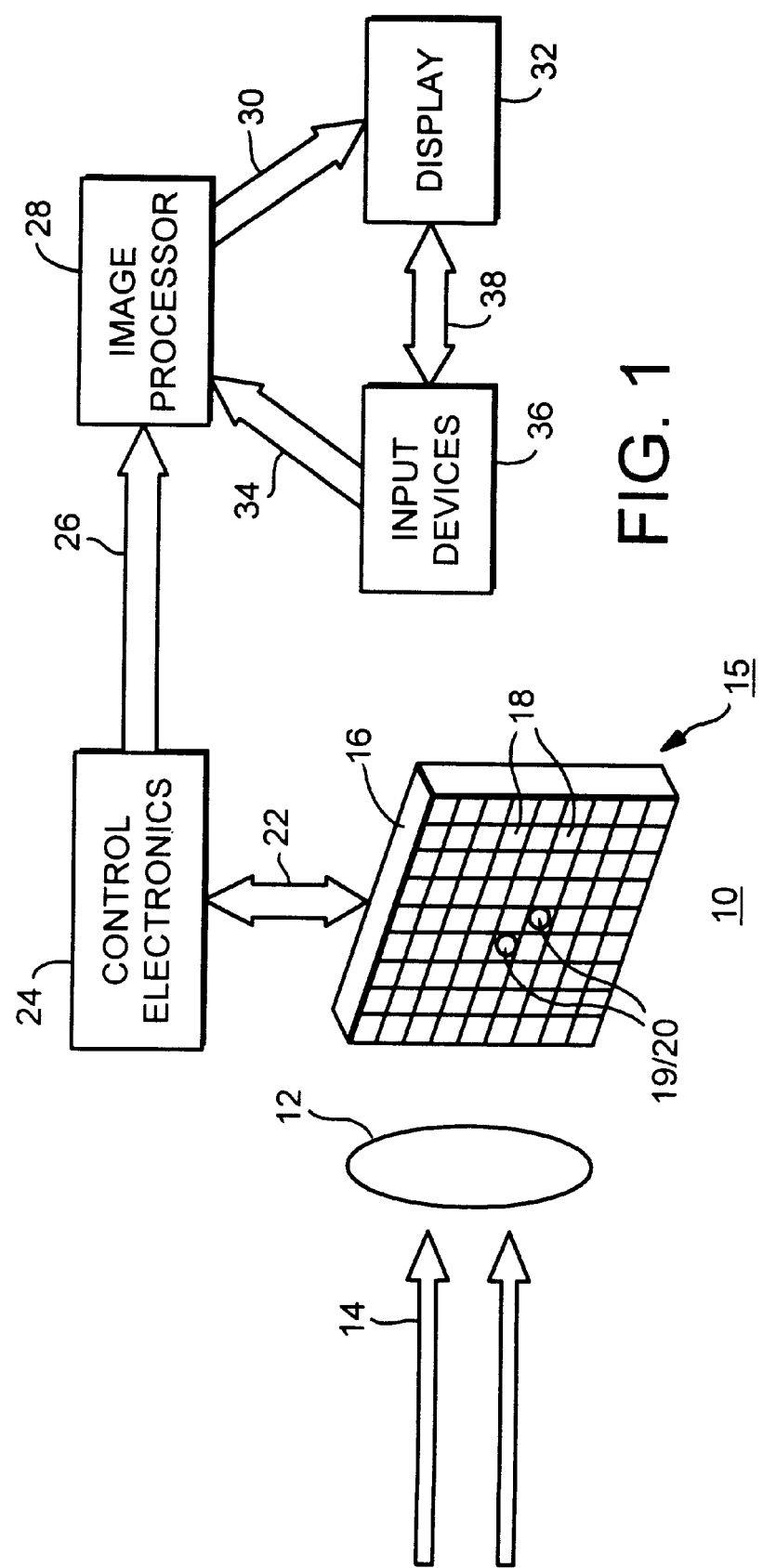
FIG. 1 is a schematic representation of an imaging system.

FIG. 1 is a schematic representation of an example of an imaging system 10 as described in the Applicant's International application WO 95/33332 for radiation imaging of an object 12 subjected to radiation 14. The radiation may, for example, be X-ray radiation and the object 12 may, for example, be a part of a human body. The imaging device comprises an imaging array 15 including at least one Active-pixel Semiconductor Imaging Devices (ASID) 16. Although only one ASID 16 is shown schematically in FIG. 1, the imaging array will typically include a plurality of imaging devices 16. Each imaging device 16 provides a plurality of image, or pixel cells 18. Each imaging device directly detects high energy incident radiation such as X-rays, γ-rays, β-rays or α-rays and accumulates at each pixel cell, by means of a randomly accessible, active, dynamic image cell circuit on or adjacent to a corresponding image detector cell, values representative of the radiation incident at that image cell.

The imaging device 16 can be configured as a single semiconductor substrate (e.g., silicon) with each image, or pixel cell comprising an image detector cell 19 and an active image cell circuit 20, or alternatively on two substrates, one with an array of image detector cells 19 and one with an array of active image cell circuits 20, the substrates being mechanically connected to each other by, for example, microbumps (bumps-bonds).

Figure 2:
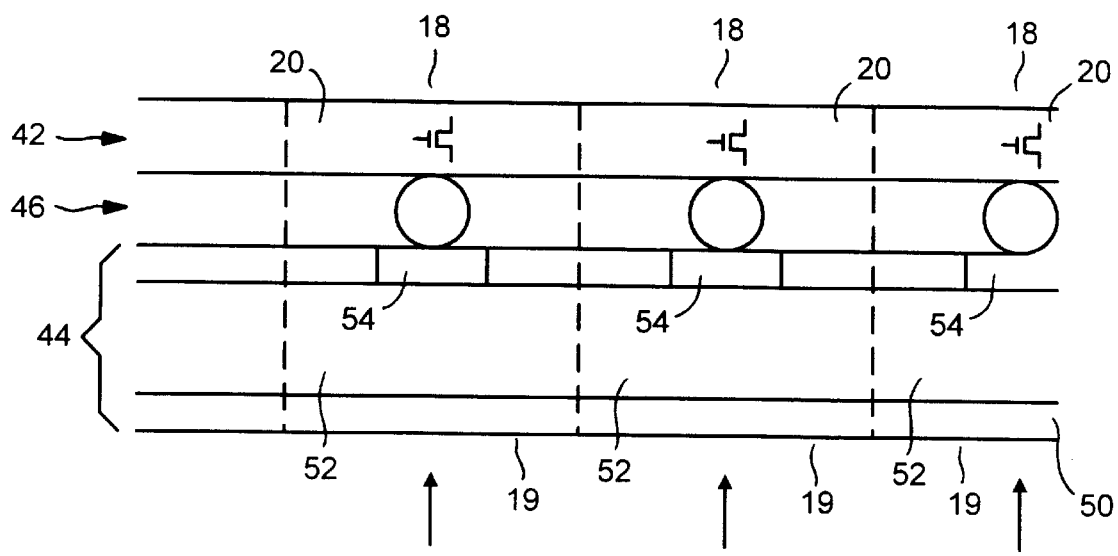
FIG. 2 is a schematic partial cross-section of an imaging device.

FIG. 2 is a schematic partial cross-sectional representation of a two-substrate imaging device showing the connection of the substrates. Individual detector cells 19 of an image detector substrate 44 are connected to corresponding cell circuits 20 of a readout substrate 42 by means of microbumps 46. The cell circuits 20 are schematically represented within the substrate 42 by means of the symbol of a FET.

The detector substrate 44 is provided with a continuous electrode 50 on the side of the substrate 44 which is exposed to incident radiation. In FIG. 2, therefore, the incident radiation is assumed to arrive in an upwards direction. On the rear surface of the detector substrate 44, a plurality of detector cell electrodes 54 are provided. It is the array of detector cell electrodes 54 which effectively defines the individual image detector cells 19 within the detector substrate 44. A bias voltage is applied to the continuous electrode 50 and image cell detection zones 52 are defined between the continuous electrode 50 and the respective detector cell electrodes 54. Each of the detector cell electrodes is electrically and mechanically coupled to a respective cell circuit 20 by a respective microbump 46. It will be appreciated that the representation in FIG. 2 is highly schematic, and not to scale.

When a photon is photo-absorbed at a detector cell 19 creating an electric charge or when a charged radiation ionizes the detection zone 52 of the detector substrate 44 at a detector cell 19, an electric pulse flows from the detector substrate detection zone 52 to the cell circuit 20 for that image cell 18.

A value associated with the electric pulse is then accumulated in an active circuit element, either directly as a charge value or as an equivalent voltage or current value such that new charge created from subsequent imcoming radiation is added continuously. Examples of possible accumulating devices are an integrated capacitor or the gate of an integrated transistor. The charge accumulation process in a cell circuit 20 continues until control signals are issued from control electronics 24 to start a process of reading out information by addressing each cell circuit 20, effectively in a random access manner. During readout of the accumulated charge values, charge continues to be accumulated. Cell circuits 20 may selectively be reset after readout to discharge the charge accumulation circuit elements, and only then are image cells inactive for a very short time with practically no dead time.

Thus, the cell circuits 20 are provided for each image cell 18 to accumulate charge created in the detector cell when, for example, a photon or a charged particle of radiation is incident on the detection zone of that detector cell 19. An active cell circuit 20 and the detector cell 19 can be of the order of a few tens of microns in size (e.g., 10–50 $\mu$m).

A schematic repesentation of an example of a cell circuit is described with reference to FIG. 3. This example of a cell circuit uses field effect transistors (FETs) arranged as a cascode connected amplifier. FET M11A 70, and in particular the gate thereof, forms charge accumulation circuitry. FET M11B 72 forms readout circuitry. FET M11C 77 forms reset circuitry. VBIAS 60 is a bias voltage input across the depletion zone forming a detector cell 19 of the image cell. The detector cell 19 is represented by a diode symbol D11. In the cell circuit itself, SIGOUT 62 is an analogue signal output and VANA 64 an analogue power supply input. RES-R-1 66 is a reset input and ENA-R-1 68 is an enable input for the cell circuit.

Charge generated in the detector cell 19 in response to incident radiation is automatically accumulated in the gate of a transistor M11A 70 when both the RES-R-1 66 and ENA-R-1 68 inputs are low. To read the image cell, ENA-R-1 68 is taken to a high state, which allows current to flow from the transistor M11A 70 through the transistor M11B 72 SIGOUT 62. The cell circuit is reset by taking RES-R-1 66 to high, whereupon after RES-R-1 66 has been at high for merely a few microseconds, any accumulated charge will have been removed from the gate of the transistor M11A 70. Immediately after RES-R-1 66 goes to a low level, charge can begin to accumulate at the gate of transistor M11A 70. If no reset pulse is supplied to the reset input RES-R-1 66, then it is to be noted that a reading operation when the enable input ENA-R-1 68 goes high does not destroy the charge but instead merely causes a current flow directly proportional to the accumulated charge. This allows multiple readings without resetting.

Figure 3:
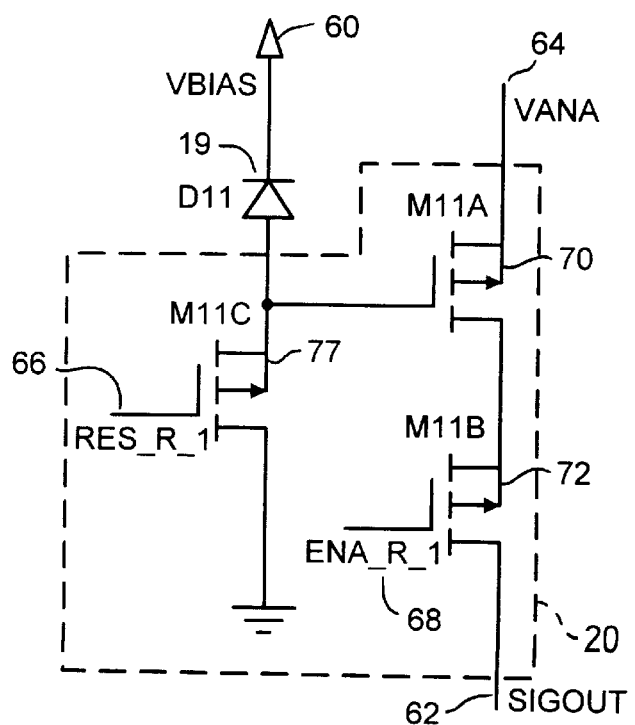
FIG. 3 is a schematic representation of an image cell circuit.

In the example shown in FIG. 3, charge accumulation ability can be maximised by arranging that the gate capacitance of a charge accumulation transistor M11A 70 forms substantially (say greater than 90% of) the input node capacitance (total capacitance) of the detector cell 19, the charge accumulation circuitry 70, the readout circuitry M11A 72 and reset circuitry 77 of FIG. 3 and minimizing the parasitic or unwanted capacitance of all other circuit (and detector) components. For a 35 $\mu$m by 35 $\mu$m cell circuit, for example, the M11A 70 capacitance can be 2 pF and the FET gate voltage dynamic range can be at least 2 Volts. This corresponds to about 25,000,000 electrons in storage capacity.

Returning to FIG. 1, the control electronics 24 includes processing and control circuitry, which is connected to the cell circuits 18 on the semiconductor substrate as represented schematically by the two-way arrow 22. The control electronics 24 enable the cell circuits 20 associated with individual image cells 18 to be addressed (e.g., scanned) for reading out charge accumulated in the cell circuits 20 at the individual image cells 18. The charge read out is supplied to Analogue to Digital Converters (ADCs) for digitisation and Data Reduction Processors (DRPs) for processing the binary signal.

The control electonics 24 is further interfaced via a path represented schematically by the arrow 26 to an image processor 28. The image processor 28 includes data storage in which it stores the digital value representative of the charge read from each image cell along with the position of the image cell 18 concerned. For each image cell 18, each charge value read from the image cell is added to the charge value already stored for that image cell so that a charge value is accumulated. As a result, each image can be stored as a representation of a two-dimensional array of pixel values which can be stored, for example, in a database.

The image processor 28 can access the stored image data in the database to select a given image (all the array) or a part of the image (a sub-sample of the image array). The image processor 28 reads the values stored for the selected image position and causes a representation of the data to be displayed on a display 32 via a path represented schematically by the arrow 30. The data can of course be printed rather than, or in addition to being displayed and can be subjected to further processing operations. For example, background and noise can be subtracted as a constant from each pixel charge value. This pedestal and/or background subtraction is possible if prior to image taking an "empty" image is acquired. For each pixel a background value is deduced and can be subtracted accordingly.

User input devices 36 connected via paths represented schematically by the arrow 34 and possibly interacting with the display 32 as represented schematically by the double arrow 38 can be used to control the operation of the imaging system. The user input devices 36 can include, for example a keyboard, a mouse, etc.

As described in the introduction, there is a need to provide a hybrid semiconductor imaging array to form the array of FIG. 1 without the disadvantages of the prior art. An embodiment of an imaging device in accordance with the invention achieves this.

Figure 4:
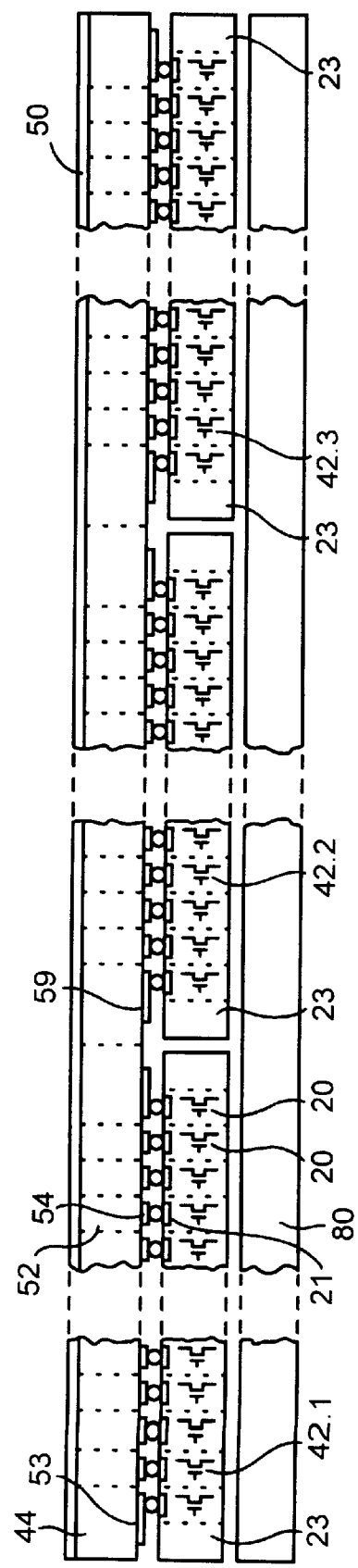
FIG. 4 is a schematic partial cross section of an example of an imaging device according to the present invention.

There follows a description with respect to FIG. 4 of an example of an imaging device according to the invention for use as the device 16 of FIG. 1.

As shown in FIG. 4, which is a partial cross section through an example of an imaging device according to the invention, the imaging device comprising a unitary radiation detector substrate 44, a plurality of readout substrates 42.1–42.6 (here 6 readout substrates of which three are visible) and a support substrate 80.

The unitary radiation detector comprises a semiconductor substrate with one surface having a continuous electrode 50 for applying bias voltage, and the opposite surface having an array of detector cell electrodes, or contacts 54 for collecting charge generated in response to radiation incident for respective radiation detector cells 19. As for the imaging device described with reference to FIG. 2, the detector cell electrodes 54 form charge collection contacts, which in combination with the bias electrode 50 effectively define detection zones 52 in the semiconductor detector substrate 44 for the individual detector cells. The detector substrate material can be, for example, of silicon (Si) or cadmium telluride (CdTe) or cadmium zinc telluride (CdZnTe), lead iodide (PbI), gallium arsenide (GaAs), or germanium (Ge) although other materials can be used. CdTe and CdZnTe are more desirable options because of their high sensitivity to X-ray energies used in medical applications and in particular intraoral imaging. The electrodes can be formed from gold or other conductors compatible with the substrate material. Passivation can be provided between the detector cell contacts to improve radiation cell definition.

The plurality of readout substrates 42 (preferably CMOS chips), each comprise a substrate comprising an array of readout circuits 20 (represented schematically by FET symbols). Respective readout circuit contacts 21 for readout circuits 20 are connected to corresponding detectors cells of the detector substrate 44. Each readout substrate 42 is mechanically and electrically connected to the detector substrate 44, preferably by bump-bonds, for example indium bumps or low temperature lead-tin based solder bonds. The readout substrate is preferably implemented in CMOS technology using a silicon substrate, although other semiconductor technologies could be used. The contacts can be made of aluminium, gold, platinum, nickel or another conductive material or combination thereof compatible with the semiconductor technology.

The support substrate 80 forms a mother board for mounting the bonded detector-readout substrate structure and for providing electrical and electronic connection to each readout substrate. In a preferred embodiment the bonded detector-readout substrate structure is mechanically attached to the support substrate by gluing and electrically connected to it by means of wire bonds.

As shown in FIG. 4, at least one and typically more detector cell electrodes on the detector substrate is out of register with its corresponding readout circuit on a readout substrate. In other words, at least one detector cell on the detector substrate is not aligned with its corresponding readout cell on a readout substrate.

The readout circuits of a readout substrate may extend to the edges of the readout substrate, but more typically, as illustrated in FIG. 4, the readout circuits do not extend to all four edges of the readout substrate leaving a non-active region 23.

For example, the edge region of a readout substrate may be occupied by control, decoding and multiplexing circuitry. Alternatively, or in addition, the edge region may be used for making electrical connections (voltages, signals) to the exterior of the substrate. In the absence of readout circuits in these edge regions, detector regions overlying such readout substrate edge regions are kept sensitive to incident radiation in the following manner.

Mostly, the readout circuit contacts are aligned with the detector cell contacts to facilitate bump-bonding. However, where the detector substrate overlies non-active regions of a readout substrate or a gap between readout substrates this is not the case. According, the detector cell contacts for detector substrate regions overlying readout substrate regions not having readout cells are arranged to be connected electrically to readout cell contacts not in alignment with the detector cells. Thus, each such detector contact is not bump-bonded directly to the readout semiconductor substrate, but is instead connected via a conductive strip 53 extending over the detector surface to a transfer contact (55, see FIG. 6) aligned with the readout cell contact. The conductive strip 53 and the transfer 55 are formed on the detector substrate but are insulated from the surface of the detector stbstrate by an insulating layer 59. A schematic representation of this is described in more detailed layer with reference to FIG. 6. The pixel pitch in detector regions overlying readout substrate regions without readout cell contacts bumps may be different from the pixel pitch elsewhere as can be seen in FIG. 4. This allows, inter alia, for the detector surface taken up by the conductive tracks. It should be noted that the same approach of using conductive tracks from detector cell contacts on the detector substrate to further contacts for bonding to readout cell contacts on a readout substrate can also be used to provide image continuity in areas of the detector corresponding to the, albeit small, gaps between the readout substrates.

The assembly of the detector substrate with a plurality of readout substrates mechanically and electrically connected thereto is mounted on a support substrate. The support substrate, as well as mechanically supporting the assembly, also provides electrical connections to the readout chips. The assembly can be mechanically bonded to the support substrate by adhesives, or other methods, and electrical connections can be made, for example, by means of wire bonds with the readout substrates. Alternatively, mechanical and electrical connections can be made by bump-bonding or other such techniques. In this case the readout substrate are bump-bonded to the detector substrate on an upper surface of the readout substrates and are bump-bonded to the support substrate on a lower surface of the readout substrates (not shown in FIG. 4). The support substrate can, for example, be a printed circuit board (PCB).

Figure 5:
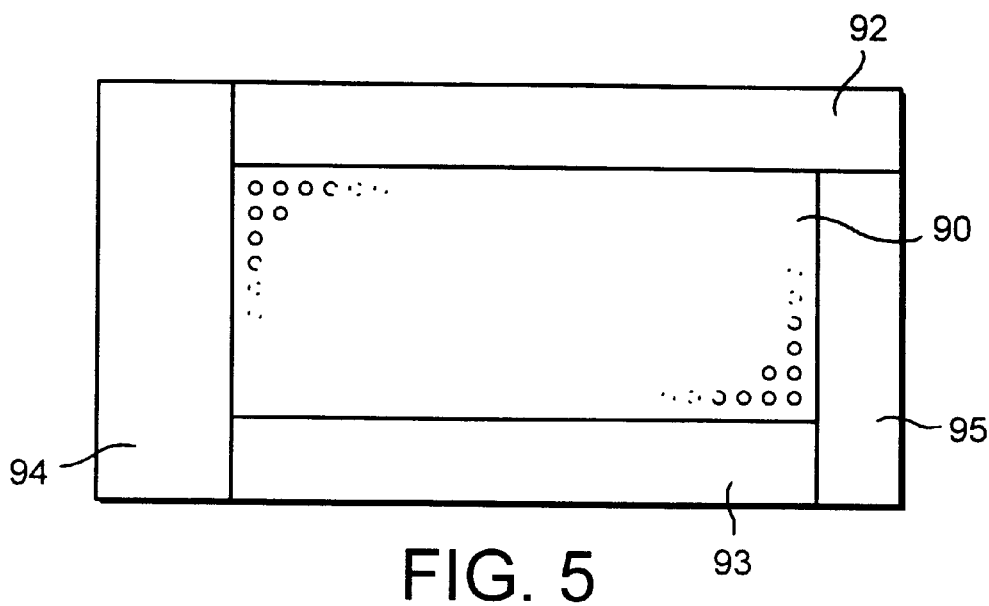
FIG. 5 is a schematic plan view of an example of a readout substrate.

FIG. 5 is a schematic plan view of one readout substrate formed by a CMOS chip. The CMOS readout chip 42 has readout cell circuits in region 90 with a corresponding array of read contacts. Edge regions 92, 93, 94 and 95 do not include readout circuits and therefore do include readout cell contacts for bump-bonding. In the example, the edge region 94 is used to allow the connection of wire bonds to the support substrate and should not be covered by the detector substrate. The region 92 is reserved for additional circuitry such as control, decoding and multiplexing. The regions 92, 93 and 95 however, can be covered by the detector.

Figure 6:
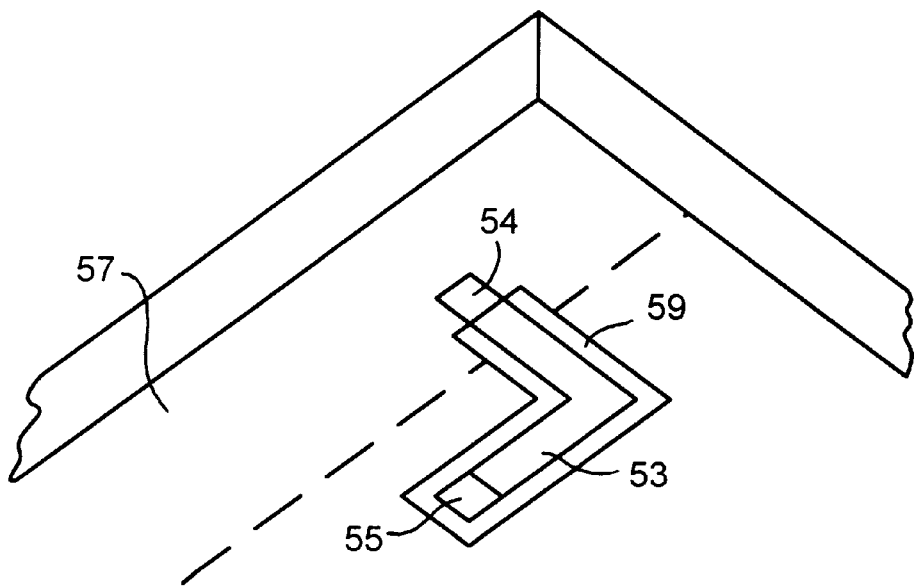
FIG. 6 is a schematic representation of part of a detector substrate.

FIG. 6 illustrates part of the surface of detector substrate used for contacting the readout substrate. As shown in FIG. 6, a detector cell contact 54 in a region 57 is connected to a transfer contact 55 by a conductive track 53 on the detector substrate 44. The transfer contact 55 is bump-bonded to a readout cell contact (not shown) on a readout substrate. The conductive track 53 can be of any required shape. To avoid the conductive track and the transfer contact 55 forming a large detector cell, they are electrically insulated from the surface of the detector substrate material by, for example, formed the conductive track and the transfer contact over a layer 59 (shown as a partial layer in FIG. 6) of passivation (e.g. aluminum nitride or silicon dioxide) or another insulating material. In one embodiment, the passivation material can be provided on the detector substrate surface between all detector cell contacts, with conductive tracks 53 and transfer contacts 55 simply formed over the passivation layer. The region 57 could be a region of the detector substrate overlying one of the readout chip regions 92 or 95 (not shown in FIG. 6), or alterative a gap between two adjacent readout chips. Alternatively, the conductive track can be formed on or within an intermediate substrate (not shown).

The shapes and sizes of the region and track shown in FIG. 6 are for illustrative purposes only and can be configured to a particular application. For example, the region 57 does not necessarily extend to an edge of the detector substrate 44, but can be located at any position with respect to the detector and can have any size or shape. In this manner, the entire radiation entrance surface of detector substrate 44 can be sensitive to radiation and the readout substrates 42 can, in combination, be responsive to radiation incident at any position of the detector substrate 44.

Thus, in this embodiment, the edge regions 92, 93, 95 of the CMOS readout chips are completely covered by the semiconductor substrate. The edge regions 94 of the readout chips are however exposed as illustrated in FIG. 7, which is a plan view from the radiation receptive surface of the radiation detector, showing the regions 94 of the readout chips 42.1–42.6 extending beyond the upper and lower edges (as viewed in FIG. 7) of the detector substrate 44 for electronic and electrical connections between the readout chips 42.1–42.6, and also showing the support substrate 80 and the wire bonds 81.

Preferably, the adjacent edges of the readout chips 42.1–42.6 do not come into physical contact so as to facilitate the bump-bonding process. The gap between the readout chips can be compensated for by regions 57 having translation of the detector cell outputs in the same manner shown in FIG. 6 as far as the non-active portions 92, 93 and 95 of the readout chips. As described above, the detector cell (pixel) pitch in the detector regions 57 may be different from elsewhere.

Figure 7:
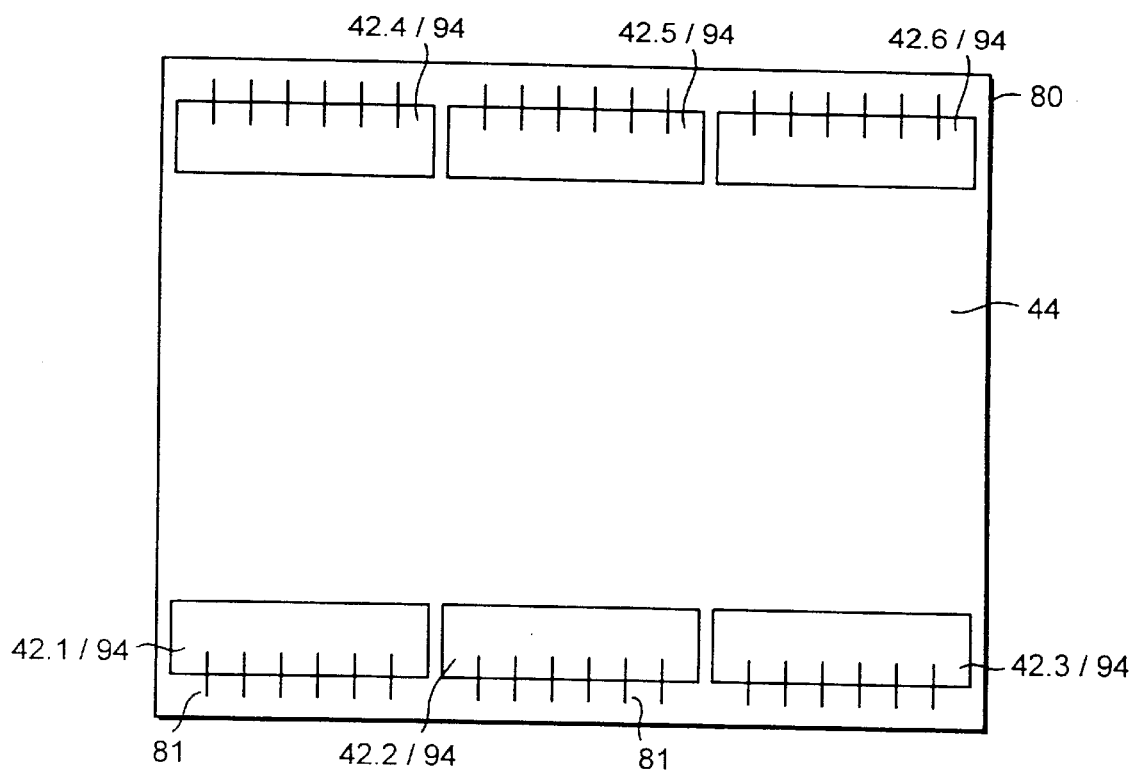
FIG. 7 is a schematic plan view of an example of an imaging device according to the present invention.

As shown in FIG. 7, the structure comprising the detector substrate 44 and the plurality of readout substrates 42 is mounted on a mother board, or support substrate 80. In order to provide the connections to the support substrate 80, thus extends somewhat beyond the periphery of the readout substrates 42 as shown in FIG. 7. In the present instance the connections between the readout substrates 42 and the supports substrate 80 is formed by wire bonds 81 and the readout substrates are secured to support substrate by adhesives.

In this example implementation, the approximate chip dimensions are 18.13 mm×9.65 mm. The edge area 94 has dimensions of approximately 0.55 mm×9.65 mm so the total active area of semiconductor substrate 42 of FIG. 7 is 35.16 mm×28.95 mm. The pixel pitch in detector areas overlying CMOS chip areas 20 can be as low as 35 micrometres square and the pixel pitch in areas 92 of the detector can be larger, for example 140 micrometers square, for pixels overlying the edges 92 and 70 micrometers for pixels overlying the edges 93, 95. As mentioned above, the support substrate 90 extends over sides 24 of readout chips in order to provide for wire bonding connections. Preferably, the support substrate extends no more than 2 mm from each side. More preferably, the board extends no more than 1 mm on each side. Even more preferably, the board extends no more than 0.5 mm on each side.

In this example implementation, the detector thickness can be around 0.3 mm–1.0 mm if the detector is made of Si, or be 0.5 mm–5.0 mm if the detector is made of CdTe or CdZnTe. The CMOS chip is approximately 0.5 mm thick and the support substrate thickness around 0.3 mm–0.4 mm.

In this example implementation, any number of chips can be arranged in a 2×n matrix where n is an integer. Where the readout chip has an exposed edge 94, this constrains the matrix to have the "x2" form with two rows of readout substrates.

In another example implementation of the preferred embodiment, readout chip edge regions 24 need not be exposed. In this alternative embodiment electrical and mechanical connection of the readout substrate to the support substrate can be achieved via their common surface (e.g. by means of bump-bonding) with electrical connections running through the readout substrate chip perpendicular to the plane of FIG. 6. In this alternative implementation, larger areas can be covered as the chips may be arranged in a matrix of the form m×n where m and n can be any integers. In this implementation the numbers of detector cell contacts which are not in alignment with their corresponding readout cell contacts may be reduced with respect to the embodiment of FIG. 6 However, detector and readout cells not in register with each other and pixel pitch variations along the imaging surface will typically be encountered.

A preferred method for fabricating such an imaging device is to bump-bond chips sequentially. Chip quality control would be extremely useful in order to reduce the probability of bonding defective chips. However, defective chips can be removed and, after cleaning of detector contacts, new chips can be bonded.

Thus, each CMOS chip is bump-bonded onto the detector substrate following quality control. Defective chips may be subsequently removed after bonding. In that case, contact points on the detector cleaned before a new CMOS chip is bonded.

Although particular dimensions for and numbers of individual elements are given for the embodiments described, it will be appreciated that these are merely given by way of example and can be adapted to any particular application and/or technology used in a particular application of the invention.

Indeed, although particular exemplary embodiments of the invention have been described, it will be appreciated that these are by way of example only, and that many modifications/additions and alternatives to the embodiments may be envisaged within the scope of the invention.

What we claim is:

1. A hybrid semiconductor imaging device comprising:
    a detector substrate, which detector substrate has a bias contact on a first surface and a plurality of detector cell contacts on a second surface; and
    a plurality of readout substrates, each readout substrate comprising a plurality of readout circuits and a corresponding plurality of readout circuit contacts, said plurality of readout substrates being connected to said detector substrate with said readout circuit contacts electrically connected to respective detector cell contacts,
    wherein at least one readout circuit contact is offset with respect to a said respective detector cell contact.

2. A device according to claim 1, wherein said plurality of readout substrates are bump-bonded to said detector substrate.

3. A device according to claim 1, wherein a conductive track extends from said respective detector cell contact to a transfer cell contact position aligned with said at least one readout cell contact.

4. A device according to claim 3, wherein said conductive track is formed on said second surface of said detector and is electrically insulated therefrom by an intermediate insulating layer.

5. A device according to claim 3, wherein said conductive track is formed on an intermediate substrate.

6. A device according to claim 1, comprising a support substrate, said support substrate being attached and electrically connected to said readout substrates.

7. A device according to claim 6, wherein said readout substrates are connected to said detector substrate at a first surface of said readout substrates, said readout substrates being attached and electrically connected to said support substrate at a second surface of said readout substrates.

8. A device according to claim 6, wherein said readout substrates are bump-bonded to said support substrate.

9. A device acording to claim 6, wherein said readout substrates are electrically connected to said support substrate by wire bonds.

10. Imaging apparatus comprising a device according to claim 1.

11. A method of manufacturing a hybrid semiconductor imaging device, said method comprising:

forming a detector substrate, which detector substrate has a bias contact on a first surface and a plurality of detector cell contacts on a second surface; and sequentially connecting a plurality of readout substrate, each readout substrate comprising a plurality of readout circuits with respective readout circuit contacts, said plurality of readout substrates being connected to said detector substrate with said readout circuit contacts electrically connected to respective detector cell contacts and with at least one said readout circuit contact offset with respect to said respective detector cell contact.

12. A method according to claim 11, wherein said plurality of readout substrates are bump-bonded to said detector substrate.

13. A method according to claim 11, comprising mechanically and electrically connecting a support substrate to said readout substrates.

* * * * *

UNITED STATES PATENT AND TRADEMARK OFFICE
CERTIFICATE OF CORRECTION

PATENT NO.        : 6,323,475 B1  
APPLICATION NO.   : 09/095152  
DATED             : November 27, 2001  
INVENTOR(S)       : Spartiotis et al.

Page 1 of 1

It is certified that error appears in the above-identified patent and that said Letters Patent is hereby corrected as shown below:

In the Title Page: Change "(75) Inventors: Konstantinos Evangelos Spartiotis, Athens (GR); Jouni <u>Hari</u> Pyyhtiä, Vantaa (FI); Miltiadis Evangelos Sarakinos, Geneva (CH)"

to

--(75) Inventors: Konstantinos Evangelos Spartiotis, Athens (GR); Jouni <u>Ilari</u> Pyyhtiä, Vantaa (FI); Miltiadis Evangelos Sarakinos, Geneva (CH)--

Signed and Sealed this

Eleventh Day of November, 2008

JON W. DUDAS  
*Director of the United States Patent and Trademark Office*